United States Patent
Pace et al.

[11] Patent Number: 6,008,670
[45] Date of Patent: Dec. 28, 1999

[54] DIFFERENTIAL CMOS LOGIC FAMILY

[75] Inventors: Bradley D. Pace; Barbara J. Duffner, both of Ft. Collins, Colo.; Holger Engelhard, Nufringen, Germany

[73] Assignee: Hewlett-Packard, Palo Alto, Calif.

[21] Appl. No.: 08/914,195

[22] Filed: Aug. 19, 1997

[51] Int. Cl.⁶ ............................................. H03K 19/0948
[52] U.S. Cl. ........................... 326/115; 326/50; 326/121; 327/408
[58] Field of Search ............................... 326/17, 115, 112, 326/119, 121, 49–50; 327/407–408

[56] References Cited

U.S. PATENT DOCUMENTS

| | | | |
|---|---|---|---|
| 4,686,392 | 8/1987 | Lo ............................................. | 326/49 |
| 5,124,588 | 6/1992 | Baltus et al. ............................... | 326/50 |
| 5,149,992 | 9/1992 | Allstot et al. ............................. | 326/115 |
| 5,216,295 | 6/1993 | Hoang . | |
| 5,298,810 | 3/1994 | Scott et al. ................................ | 327/407 |
| 5,319,348 | 6/1994 | Lee et al. .............................. | 340/146.2 |
| 5,583,456 | 12/1996 | Kimura ..................................... | 326/115 |
| 5,625,308 | 4/1997 | Matsumoto et al. ..................... | 327/203 |
| 5,798,658 | 8/1998 | Werking ................................... | 326/115 |

FOREIGN PATENT DOCUMENTS

| | | | |
|---|---|---|---|
| 0511711A2 | 11/1992 | European Pat. Off. ..... | H03K 19/173 |
| 0548551A1 | 6/1993 | European Pat. Off. ..... | H03K 19/094 |
| 0731563A2 | 3/1995 | European Pat. Off. ........ | H03K 19/08 |

OTHER PUBLICATIONS

Serial No. 08/855,976 filed May 14, 1997 Means For Virtual Deskewing of High/Intermediate/Low Dut Data of Barbara J. Duffner, et al.

IEEE Journal Of Solid–State Circuits, vol. 31, No. 4, Apr. 1996, "An Efficient Charge Recovery Logic Circuit", 9 pages, by Yong Moon and Deog–Kyoon Jeong.

*Primary Examiner*—Jon Santamauro

[57] ABSTRACT

Disclosed herein is a differential CMOS cell that achieves faster switching speeds than conventional CMOS logic by 1) biasing a differential pair of output nodes to a relatively high logic low voltage threshold, and 2) pulling up the differential pair of output nodes to a logic high voltage level. The differential CMOS cell is designed such that the difference between logic low and logic high voltage thresholds is much less than in traditional CMOS circuits (i.e., approximately 0.8 V–1.0 V as compared to 2.6 V). A lower voltage swing allows for fast switching of a differential output signal. In a preferred embodiment, the differential CMOS cell receives a primary differential input signal, and respective first and second secondary differential input signals. The differential CMOS cell includes a differential pair of arm circuits, each comprising a primary input switch for receiving a component of the primary differential input signal, and a differential pair of secondary input switches for receiving either the first or second secondary differential input signal. Each arm circuit is coupled between a current source and a voltage source. In operation, the primary differential input signal selects one of the first or second secondary differential input signals to be output as the differential output signal.

5 Claims, 6 Drawing Sheets

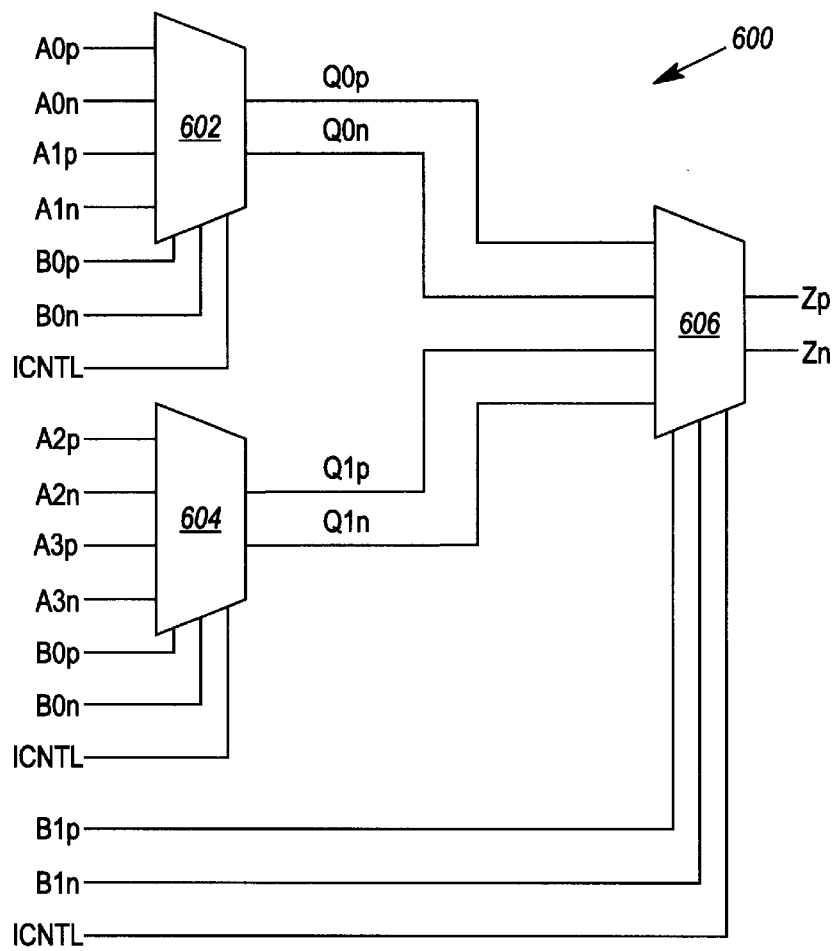
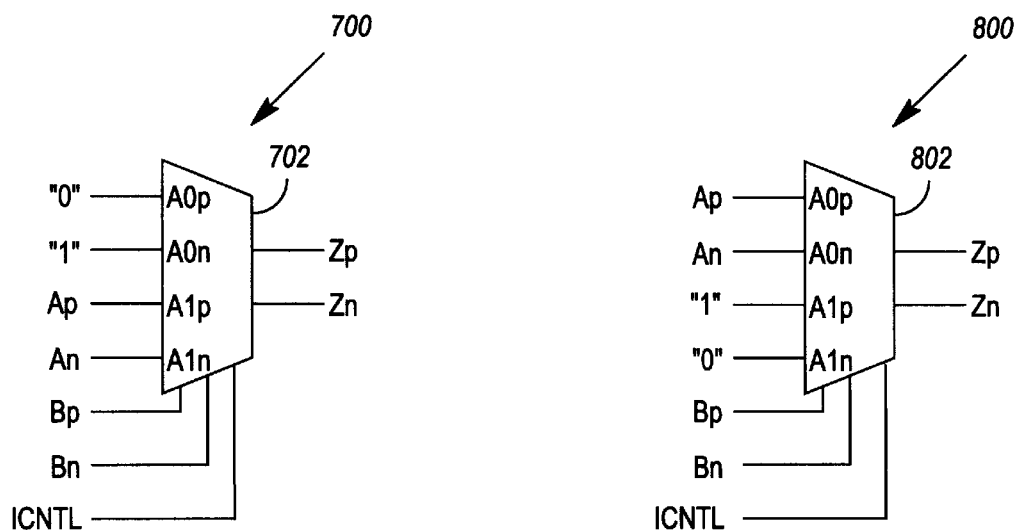
FIG. 6
FIG. 7
FIG. 8

DIFFERENTIAL CMOS LOGIC FAMILY

FIELD OF THE INVENTION

The following description pertains to CMOS (complementary metal oxide semiconductor) logic technology, and more particularly, to a method and apparatus for implementing a family of logic gates using a novel, high-speed, differential CMOS cell.

BACKGROUND OF THE INVENTION

Designers and manufacturers of electronic systems continually seek methods for increasing the speed and efficiency of electronic circuits. One method for increasing system efficiency and speed is to integrate as much of the system as possible into a single CMOS integrated circuit (IC). A well-designed CMOS IC chip increases the noise immunity of internal signals. Such high-level integration also increases the speed and efficiency of the IC chip, because signals have less distance to travel.

In a binary logic circuit for implementing a logic function, inputs and outputs of the logic function are generally represented as either a high logic level (i.e., a "1") or a low logic level (i.e., a "0"). FIG. 1 is a graphical illustration of the relationship in a binary logic circuit between a high reference voltage threshold (VREFH), a low reference voltage threshold (VREFL), and voltage levels recognized by a logic circuit with respect to these voltages. Thus, as shown in FIG. 1, a "1" is detected, and a signal is said to be in a valid high state, whenever the signal is equal to or above the high reference voltage threshold defined by VREFH. Likewise, a "0" is detected, and a signal is said to be in a valid low state, whenever the signal is equal to or below the low reference voltage threshold defined by VREFL. However, when the input signal is transitioning from one state to another (i.e., when the input signal is above the low reference voltage threshold VREFL, but below the high reference voltage threshold VREFH), it is not recognized as valid and is said to be "floating".

In a binary digital system, the specific voltage levels defined by VREFH and VREFL may vary depending upon the family of components used, the process used, and the specific application. For example, in transistor-transistor logic (TTL), VREFH is typically +2.0 volts and VREFL is typically +0.8 volts. Likewise, for CMOS logic components, VREFH is typically +3.3 volts and VREFL is typically +0.7 volts (assuming a +5.0 volt supply). For ECL logic components, VREFH is typically -1.105 volts and VREFL is typically -1.475 volts.

Today, logic circuits are commonly implemented in CMOS. However, as illustrated in FIG. 1, the voltage swing required to change a signal from logic "0" to logic "1" or vice versa is at least 2.6 V.

The switching time of a logic gate can be improved by decreasing the voltage swing required of a logic component. For example, ECL logic components only require a voltage swing of approximately 0.37 V to change signal from logic "0" to logic "1" or vice versa. The switching time is much faster for ECL logic components than for CMOS logic components because it takes far less time to pull a voltage level on a component 0.37 V than it does to pull a voltage level 2.6 V. However, despite the faster switching speeds of ECL components, ECL logic is not typically used in integrated circuits due to the greater power consumption of ECL components. In other words, the cost of providing low voltage swings (and hence faster switching speeds) is greater power consumption. Furthermore, CMOS and ECL logic components cannot be combined on the same IC chip because they are fabricated using different processes.

Accordingly, it would be desirable to provide a family of fast CMOS logic gates which could be integrated into a CMOS logic circuit in speed critical paths. Moreover, it would be desirable to implement such a family of fast CMOS logic gates using a generic logic cell which could be configured in a number of ways to provide for different logic functions. The use of a generic logic cell would enable designers to easily predict delay times and circuit loads for a given logic path.

SUMMARY OF THE INVENTION

The present invention provides such a generic logic cell. The high speed of the disclosed "differential CMOS cell" is achieved by providing a low voltage swing between logical "on" and "off" states (i.e., high and low valid voltage states).

A family of fast CMOS logic gates may be constructed by configuring and/or combining multiple instances of a single differential CMOS cell. This allows for ease in design by providing easily predictable delay times and circuit loads. Moreover, because the generic logic cell of the present invention is differential, the noise immunity of a logic circuit implemented using such a cell is increased.

It will be noted that the design of such a differential CMOS cell inherently presents a design trade-off. As switching speeds are increased, so is power consumption. Typically, the disclosed differential CMOS cells will only be used in speed critical logic paths, where the need for speed outweighs any desire for keeping power consumption low.

The differential CMOS cell disclosed in detail below receives at least a primary differential input signal comprising a primary input signal and a complement primary input signal. The differential CMOS cell may also receive a first secondary differential input signal comprising a first secondary input signal and a first complement secondary input signal, and a second secondary differential input signal comprising a second secondary input signal and a second complement secondary input signal, depending on the configuration of the circuit.

When the differential CMOS cell has the capability of receiving only the differential primary input signal, the differential CMOS cell operates as a buffer circuit, wherein the differential output signal of the cell is a buffered version of the primary differential input signal.

When the differential CMOS cell also has the capability of receiving the secondary differential input signals, the differential CMOS cell may be configured in a number of ways, and/or combined with additional differential CMOS cells, to provide circuits for implementing an entire family of logic functions.

In a preferred embodiment, the differential CMOS cell includes a first primary input switch for receiving the primary input signal. The first primary input switch is coupled between a first node to which a current source is connected, and a second node to which a first terminal of a first resistive load is coupled. A second primary input switch is also included. The second primary input switch receives the complement primary input signal, and is coupled between the first node, and a third node to which a first terminal of a second resistive load is coupled. Second terminals of the first and second resistive loads are coupled to a voltage source. The cell's differential output comprises outputs from the cell's second and third nodes.

If the differential CMOS cell has the capability of receiving secondary differential input signals, it may also include a first secondary input switch for receiving the first secondary input signal. The first secondary input switch is coupled between the first primary input switch and the second node. A second secondary input switch receives the first complement secondary input signal, and is coupled between the first primary input switch and the third node. A third secondary input receives the second secondary input signal, and is coupled between the second primary input switch and the second node. And finally, a fourth secondary input switch receives the second complement secondary input signal, and is coupled between the second primary input switch and the third node. In this configuration, the differential CMOS cell operates as a 2-input multiplexor, such that the primary differential input signal selects either the first secondary differential input signal or the second secondary differential input signal to be output as the differential output signal.

As previously stated, the differential CMOS cell of the present invention may be configured to provide an entire family of logic functions. In one configuration, an n-input multiplexor is constructed using a plurality of the above described 2-input multiplexors. Other configurations and/or combinations of generic cells provide for AND gates, OR gates, XOR gates, latches, D-type flip flops, toggle flip-flops, and various other logic components.

The differential CMOS cell essentially achieves its fast switching speed by using a pair of load resistances to 1) bias a differential pair of output nodes (i.e., the first and second nodes, supra) to a relatively high logic low voltage threshold, and 2) pull up the differential pair of output nodes to a logic high voltage level when current is not flowing through the load resistances. Importantly, the difference between the logic low voltage level and the logic high voltage level in the disclosed differential CMOS cell is much less (approximately 0.8 V to 1.0 V) than the difference between traditional CMOS logic low and logic high voltage levels (approximately 2.6 V). Faster switching of the differential output signal is therefore possible.

These and other important advantages and objectives of the present invention will be further explained in, or will become apparent from, the accompanying description, drawings and claims.

BRIEF DESCRIPTION OF THE DRAWINGS

An illustrative and presently preferred embodiment of the invention is illustrated in the drawings in which:

FIG. 6 is a schematic of a preferred 4-input multiplexor implemented using the differential CMOS cell of the present invention;

FIG. 7 is a schematic of a logical AND gate implemented using the differential CMOS cell of the present invention;

FIG. 8 is a schematic of a logical OR gate implemented using the differential CMOS cell of the present invention;

DESCRIPTION OF THE PREFERRED EMBODIMENT

Figure 1:
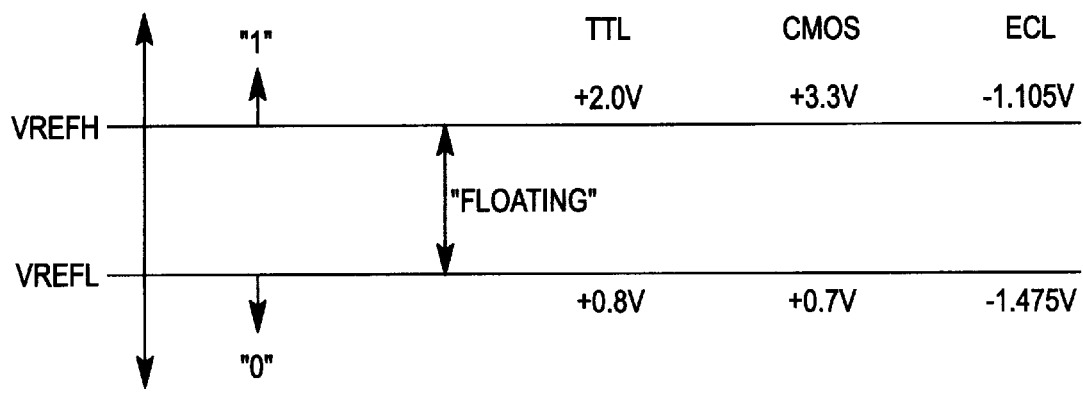
FIG. 1 is a graphical illustration of the relationship in a binary logic system between a high reference voltage threshold, a low reference voltage threshold, and voltage levels recognized by a binary logic circuit with respect to these voltages.
Figure 2:
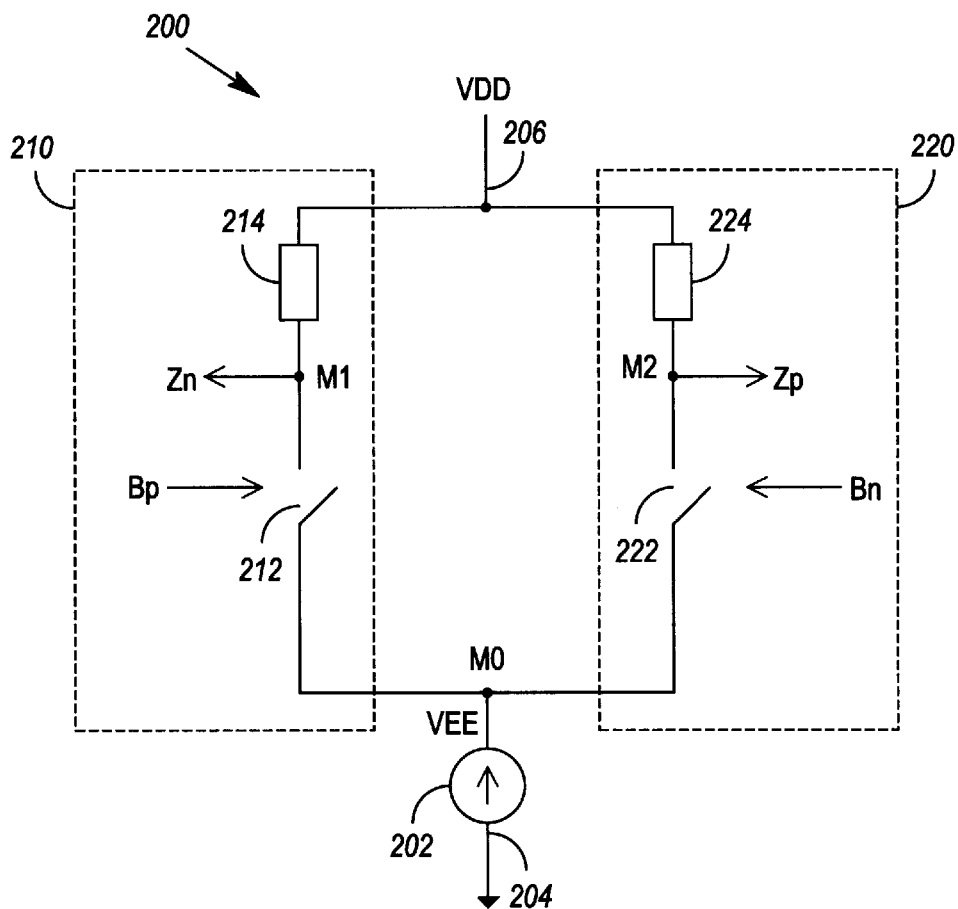
FIG. 2 is a schematic of a simple differential CMOS buffer circuit designed in accordance with the present invention.

FIG. 2 illustrates a simple differential CMOS buffer circuit 200 designed in accordance with the present invention. As shown in FIG. 2, the differential CMOS buffer circuit receives at least one differential input signal B, comprising components Bp and Bn, and outputs a differential output signal Z comprising components Zp and Zn. As used hereinafter, the term "differential signal" refers to a signal Xp, and its complement Xn, where X is the name of the signal. In the preferred embodiment, the logic low level of a signal is defined at approximately 2.3 V–2.5 V, and a logic high level of a signal is defined to be VDD, or approximately 3.3 V. It will be appreciated that the voltage swing between a logic low and a logic high level is approximately only 0.8 V–1.0 V, as opposed to the typical 2.6 V swing in normal CMOS circuits, as described previously. An important advantage of using such a low voltage swing is increased speed.

As shown in FIG. 2, the differential CMOS buffer circuit 200 includes a current source 202 coupled between a circuit ground, hereinafter indicated by the upside-down triangular symbol at 204, and a node M0. Current sources are known in the art. Accordingly, the current source 202 may be implemented using any suitable configuration of a current source which supplies a constant current to node M0.

The differential CMOS buffer circuit 200 also includes two symmetrical differential arm circuits, 210 and 220. The first and second differential arm circuits 210 and 220 are coupled in parallel between node M0 and a voltage source VDD 206.

The first differential arm circuit 210 comprises a CMOS switch 212 (sometimes referred to herein as a "first primary input switch", or generically, as a "switchable connection") coupled between node M0, and an output node M1 from which the complement signal Zn of the differential output signal pair Zn/Zp is output. The switch 212 is controlled by input signal Bp of the differential input signal pair Bp/Bn. A load resistance 214 is coupled between the voltage source VDD at 206 and the output node M1. The load resistance 214 must be high enough to bias node M1 to a logic low level ("0") when current is flowing across switch 212.

The second differential arm circuit 220 comprises a CMOS switch 222 (sometimes referred to herein as a "second primary input switch", or generically, as a "switchable connection") coupled between node M0, and an output node M2 from which the output signal Zp of the differential output signal pair Zp/Zn is output. The switch 222 is controlled by complement input signal Bn of the differential input signal pair Bp/Bn. A load resistance 224 is coupled between the voltage source VDD at 206 and the output node M2. The load resistance 224 must be high enough to bias node M2 to a logic low level ("0") when current is flowing across switch 222. Reistances 214 and 224 must be equal (or at least substantially so) to get differential signals.

Figure 3:
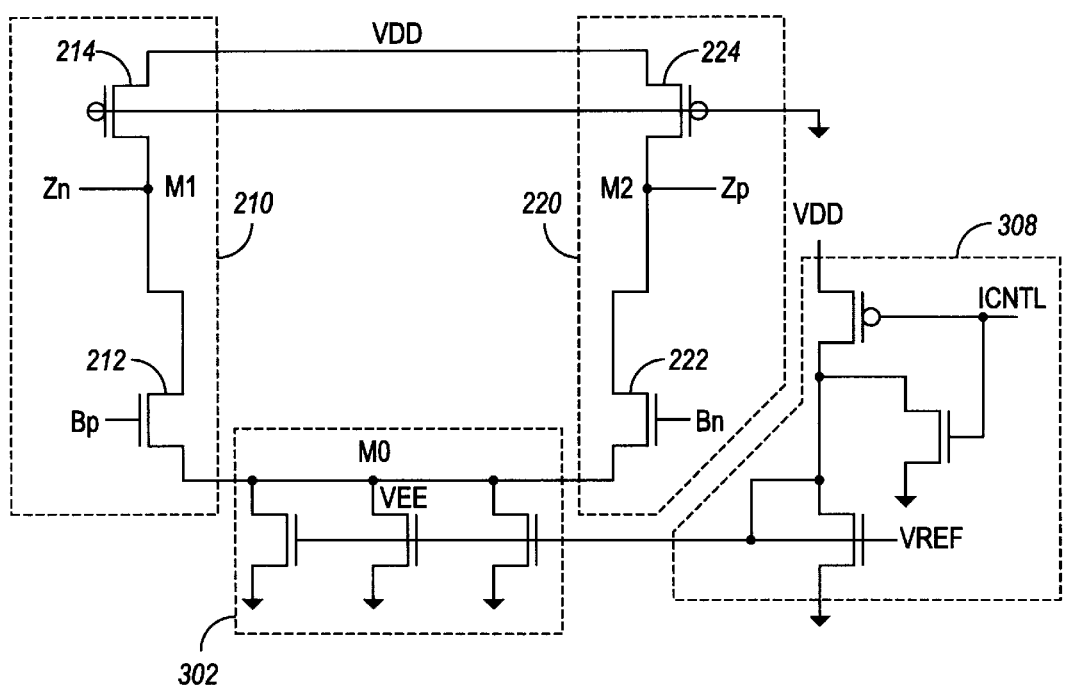
FIG. 3 is a schematic of a preferred implementation of the differential CMOS buffer circuit of FIG. 2.

FIG. 3 shows a preferred implementation of the differential CMOS buffer circuit 200 of FIG. 2. As shown in FIG. 3, the current source 202 is implemented using one or more NFETs 302 coupled in parallel between node M0 and ground. The NFETs receive a reference voltage, VREF, at their respective gates. Reference voltage VREF is derived from a reference voltage generator 308. In the preferred embodiment, the current source 202 supplies a constant current to node M0. Switch 212 is implemented with an n-type metal oxide semiconductor field effect transistor (NFET), and is turned on to form an electrical connection between nodes M0 and M1 if the voltage between the gate of NFET 212 (its control input) and node M0 is above a threshold voltage, typically 0.6 V–0.7 V. In symmetry, the switch 222 in arm circuit 220 is also implemented with an NFET, and is turned "on" to form an electrical connection between nodes M0 and M2 if the voltage between the gate of NFET 222 and node M0 exceeds the threshold voltage. The symmetrical load resistances 214 and 224 in the preferred embodiment are implemented using p-type metal oxide semiconductor field effect transistor (PFETs) coupled between voltage source VDD and nodes M1 and M2, respectively. Their gates are coupled to the circuit ground.

In operation, if the differential input signal is a logic high ("1"), input signal Bp is at a logic high voltage level (typically 3.3 V), and complement input signal Bn is at a logic low voltage level (typically 2.3 V–2.5 V). Accordingly, switch 212 in the first arm circuit 210 will turn "on", causing node M1 to be pulled down. The current supplied by current source 202 across the effective resistance of the NFET switch Bp determines the pull-down voltage level of M1. Accordingly, in the preferred embodiment, the current source, and size of NFET 212, are designed to provide a low voltage level of approximately 2.3 V–2.5 V on node M1.

Simultaneously, complement input signal Bn is at a logic low voltage level. Accordingly, switch 222 is "off". Consequently, no current flows across switch 222, and node M2 is pulled up to a logic high voltage level (i.e., to approximately VDD) via the load resistance 224. It will be appreciated by one skilled in the art that the differential CMOS cell 200 is faster than conventional CMOS logic for the reason that the voltage swing on the output nodes M1 and M2 is much lower (i.e., typically a 0.8 V–1.0 V swing as compared to the 2.6 V swing of conventional CMOS operation), and it therefore takes less time to switch from high to low or vice versa.

Figure 4:
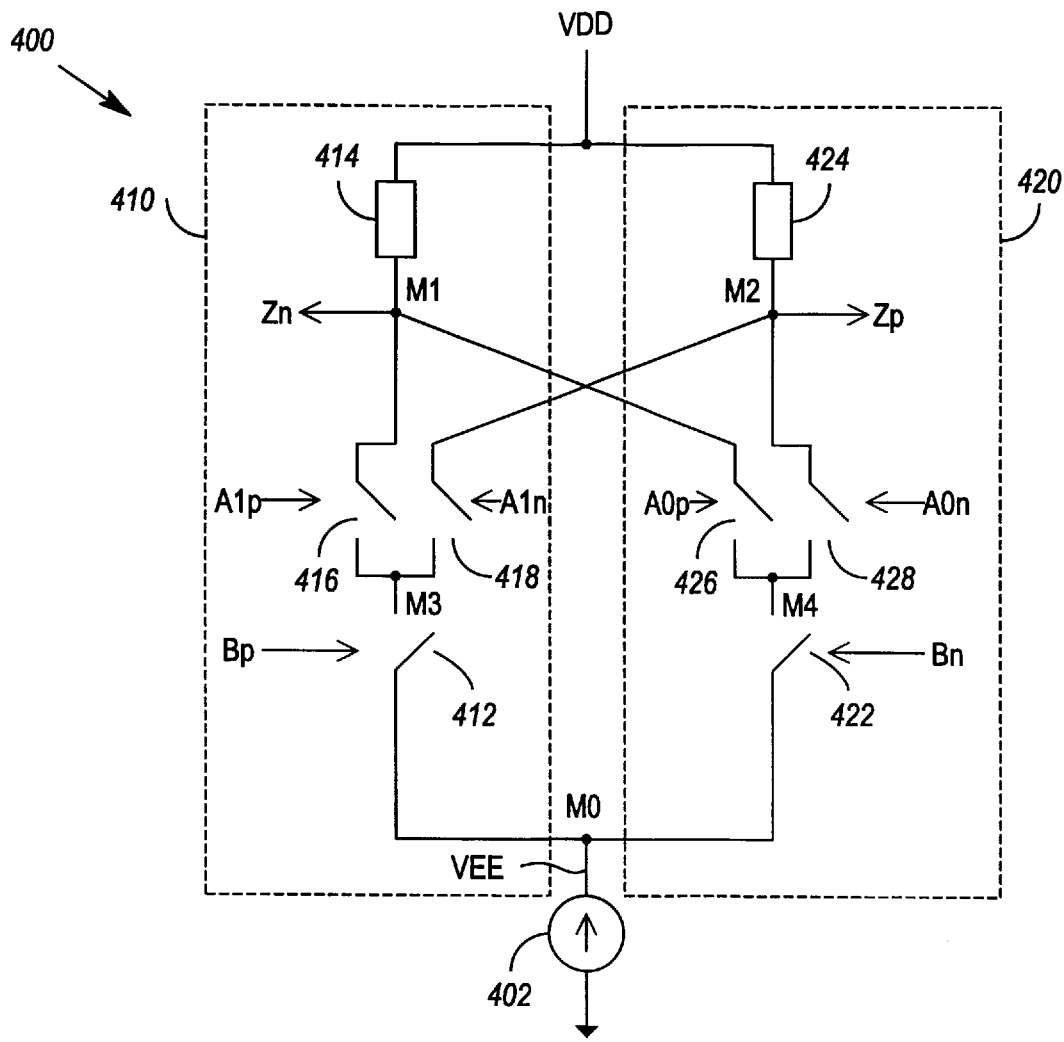
FIG. 4 is a schematic of a multiple-input differential CMOS cell designed in accordance with the present invention.

The differential CMOS buffer circuit 100 shown in FIGS. 2 and 3 is a fast CMOS logic buffer. Typically, much more complex logic gates are required to implement a CMOS logic function. Accordingly, FIG. 4 illustrates a differential CMOS logic cell which may be used as a basis for constructing an entire family of logic gates. The differential CMOS cell 400 of FIG. 4 is similar to the differential CMOS buffer circuit 200 of FIG. 2, except that each arm circuit 410 and 420 includes an additional differential pair of input switches 416/418, 426/428 (sometimes referred to herein as "secondary input switches", or generically, as "switchable connections").

Accordingly, the differential CMOS cell 400 includes a current source 402 coupled between node M0 and circuit ground. Arm circuits 410 and 420 are coupled in parallel between node M0 and voltage source VDD. Again, the current source 402 may be implemented using any technique which will supply a constant current to node M0.

Arm circuit 410 includes a switch 412 coupled between node M0 and a node M3, which may be turned "on" and "off" by the input signal Bp of the differential input signal pair Bp/Bn. A second switch 416 (sometimes referred to herein as a "first secondary input switch") is coupled between node M3, and a node MI from which complement output signal Zn of the differential output signal pair Zp/Zn is output. A third switch 418 (sometimes referred to herein as a "second secondary input switch") is coupled between node M3, and a node M2 from which output signal Zp is output. Switch 416 is controlled by one signal, A1p, of a differential input signal pair A1p/A1n, and switch 418 is controlled by the other signal, A1n. A load resistance 414 is coupled between node M1 and voltage source VDD.

Arm circuit 420 is symmetric to arm circuit 410. Arm circuit 420 includes a switch 422 coupled between node M0 and a node M4, which may be turned "on" or "off" by the complement input signal Bn of the differential input signal pair Bp/Bn. A second switch 426 (sometimes referred to herein as a "third secondary input switch") is coupled between nodes M4 and M1. A third swith 428 (sometimes referred to herein as a "fourth secondary input switch") is coupled between nodes M4 and M2. Switch 426 is controlled by one signal, A0p, of a differential input signal pair A0p/A0n, and switch 428 is controlled by the other signal, A0n. Arm circuit 420 includes a load resistance 424 coupled between node M2 and voltage source VDD.

The load resistances 414 and 424 may be implemented using any technique which will pull respective nodes M1 and M2 up to a high logic voltage level, preferably VDD.

In operation, differential input signal Bp/Bn acts as a select signal for selecting between differential input signals A1p/A1n and A0p/A0n.

Table A illustrates the select, or "multiplexor", logic function performed by the preferred embodiment of the present invention.

TABLE A

| B | Bp | Bn | Z |
|---|----|----|---|
| 0 | 0  | 1  | A0 |
| 1 | 1  | 1  | A1 |

Accordingly, if the select signal B, comprising differential input signal Bp/Bn, indicates a logic high ("1") level, current flows through arm circuit 410, and the values of differential output signal A1p/A1n are output as the differential output signal Zp and Zn. This occurs as follows: A logic high "1" on select signal B means that input signal Bp is at a high voltage level and complement input signal Bn is at a low voltage level. A low voltage level on the complement input signal Bn turns switch 422 "off", and prevents current from flowing between nodes M0 and M4 via switch 422. Accordingly, no current will flow between nodes M4 and M2 through either of the respective switches 426 and 428.

Concurrently, a high voltage level on Bp turns switch 412 "on" and allows current to flow between nodes M0 and M3 of the switching device 412. Depending on the state of A1, one component of differential input signal A (either A1p or A1n) will be at a high voltage level and the other will be at a low voltage level. If A1 is a logic high ("1"), A1p will be a high voltage level and A1n will be at a low voltage level. Accordingly, switch 416 will turn "on" to provide an electrical connection between nodes M1 and M0, through respective switches 416 and 412. This pulls node M1 down to a low voltage level. Accordingly, the complement output signal Zn will be at a low voltage level (approximately 2.3 V–2.5 V). At the same time, A1n will be at a low voltage level, and switch 418 will be "off". Consequently, no current will flow between node M2 and node M0, and node M2 will remain at a high voltage level (approximately VDD, or 3.3 V) due to the load resistance 424. Conversely, if A1 is at a logic low ("0"), A1p will be at a low voltage level, and A1n will be at a high voltage level. Accordingly, switch 418 will turn "on" to provide an electrical connection between nodes M2 and M0 through respective switches 418 and 412, and to pull node M2 down to the low voltage level. Accordingly, the output signal Zp will be at a low voltage level (approximately 2.3 V–2.5 V). At the same time, A1p will be at a low voltage level, and switch 416 will be "off". Consequently, no current will flow between node M1 and node M0, and node M1 will remain at a high voltage level (approximately VDD, or 3.3 V) due to the load resistance 414. Accordingly, when the select input signal B is a logical high ("1"), the differential output signal Zp/Zn reflects the state of the selected differential input signal A1p/A1n.

The differential CMOS cell 400 operates in a similar fashion when select signal B is at a logic low ("0") level. In this case, however, switch 412 is "off" (because select signal Bp is at a logic low voltage level) and switch 422 is "on" (because select signal Bn is at a logic high voltage level). Thus, the differential output signal Zp/Zn instead reflects the state of differential input signal A0p/A0n rather than the state of differential input signal A1p/A1n.

Figure 5:
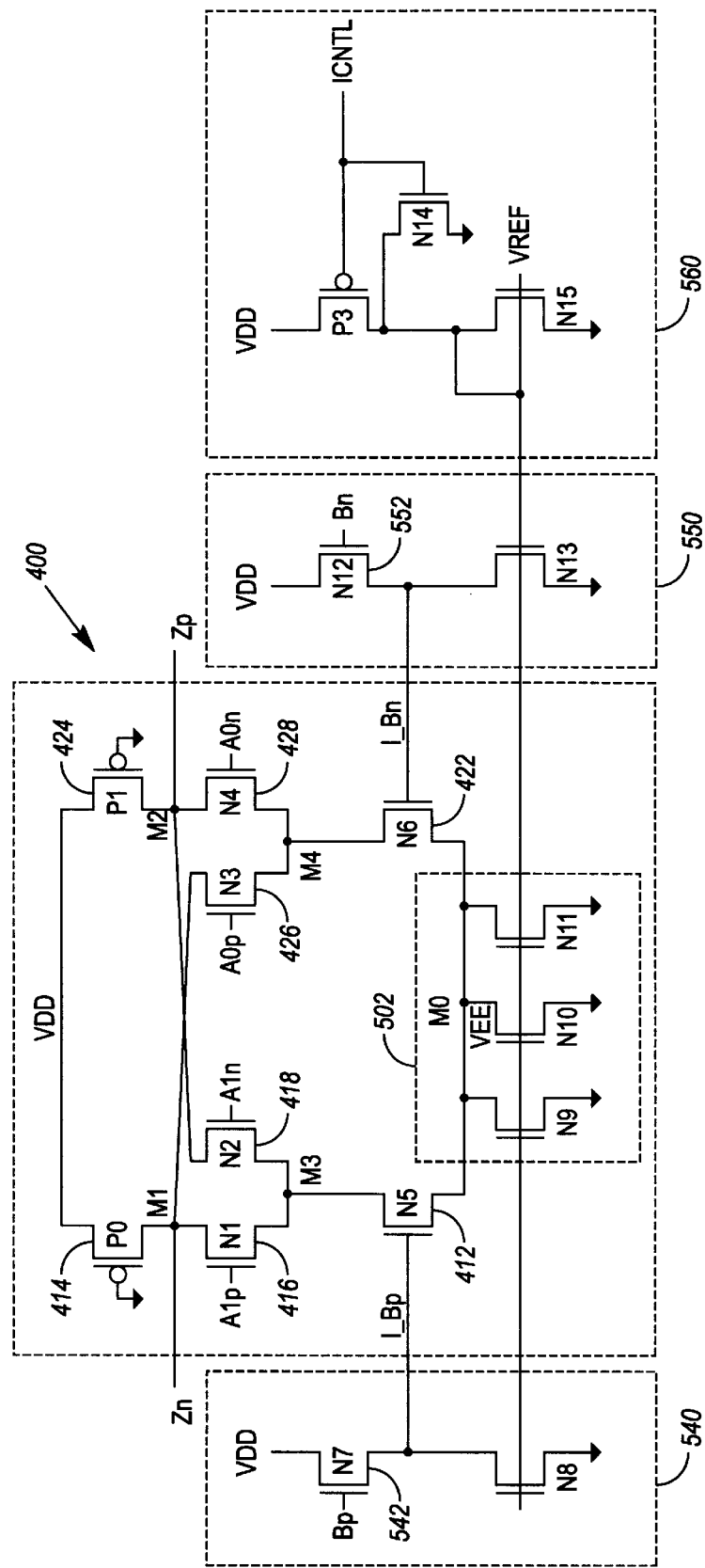
FIG. 5 is a schematic of a preferred implementation of the differential CMOS cell of FIG. 4.

FIG. 5 is a schematic of a preferred implementation 500 of the differential CMOS cell 400 of FIG. 4. As shown in FIG. 5, the differential CMOS cell 500 includes a pair of level shifters 540 and 550 which respectively receive differential select input signals Bp and Bn. The level shifters 540 and 550 operate to step down the voltage of the inputs to respective switches 412 and 422.

In the implementation shown in FIG. 5, this is necessary because Bp and Bn are input from another like cell. Accordingly, since in the preferred embodiment, a low voltage level is defined to be approximately 0.8 V–1.0 V lower than VDD (which is typically 3.3 V), the low voltage level will be approximately 2.3 V–2.5 V. Thus, a low voltage level received directly by either of respective switches 412 or 422 is not low enough to turn the respective switches completely off. The level shifters 540, 550 step the received low voltage level down by approximately 0.6 V–0.7 V (i.e., the threshold voltage of NFETs 542 and 552). Parallel NFETS 502 of current source 302 are designed to bias node M0 to 1.2 V–1.4 V. Accordingly, if Bp is stepped down from 2.5 V by 0.7 V, the voltage on the gate of NFET switch 412 or 422 will be approximately 1.8 V. Since node M0 is biased to 1.2 V–1.4 V, the threshold voltage of respective NFET switches 412, 422 are not quite reached, and thus respective switches 412 or 422 will be completely off.

The differential CMOS cell 400 also includes a reference voltage generator 560. In the preferred embodiment, the reference voltage generator 560 generates a reference voltage of approximately 1.05 V to 1.09 V, which is sufficiently above the threshold voltage (0.6 V) of the current source's parallel NFETs 502 to provide a constant current of approximately 0.65 mA to 1.05 mA to node M0.

Table B illustrates exemplary switching speeds (or propagation delays) achieved between input A (i.e., A0 or A1) and output Z, and between input B and output Z.

TABLE B

| VDD (in V) | VEE (in mV) | I_Bp (lo/hi) (in V) | Z Swing (in mV) | Switching Speed A -> Z (in psec) | Switching Speed B -> Z (in psec) |
|---|---|---|---|---|---|
| 3.30 | 766.8 | 1.343/ 2.039 | 780.1 | 96.58 | 167.1 |

As shown in Table B, switching speeds at least as fast as approximately 80 psec can be achieved with the present invention, as compared to approximately 500 psec using conventional CMOS logic gates.

The differential CMOS cells 200, 400 of the present invention may be utilized to implement an entire family of logic functions. As described with respect to FIGS. 4 and 5, the differential CMOS cell may be employed as a 2-input multiplexor. The principles of the 2-input multiplexor circuit may be extended to build a 4-input multiplexor. FIG. 6 shows a preferred embodiment of a 4-input multiplexor 600. As shown in FIG. 6, the 4-input multiplexor 600 may be implemented with two differential CMOS cells 602 and 604 whose outputs feed into a third differential CMOS cell 606. Each of the two differential CMOS cells 402 and 404 respectively receive two different differential input signals A0p/A0n, A1p/A1n, and A2p/A2n, A3p/A3n. Each of the differential CMOS cells may be implemented as shown in FIGS. 4 or 5. A first differential select input signal B0p/B0n is used as the select input signal for each multiplexor 602 and 604. Accordingly, when the first differential select input signal B0p/B0n is logically low ("0"), multiplexor 602 outputs A0p/A0n as its output differential signal Q0p/Q0n, and multiplexor 604 outputs A2p/A2n as its differential output signal Q1p/Q1n. Conversely, when the first differential select input signal B0p/B0n is logically high ("1"), multiplexor 602 outputs A1p/A1n as its differential output signal Q0p/Q0n, and multiplexor 604 outputs A3p/A3n as its differential output signal Q1p/Q1n.

Each of the differential output signals Q0p/Q0n and Q1p/Q1n output by multiplexors 602 and 604 are then used as inputs to the third 2-input multiplexor 606. A second differential select input signal B1p/B1n is used as the select input signal for the third multiplexor 606. The second differential select input signal B1p/B1n determines whether differential signal Q0p/Q0n is output as the differential output signal Zp/Zn, or whether differential signal Q1p/Q1n is output as the differential output signal Zp/Zn. If B1p/B1n is logically low ("0"), multiplexor 606 outputs Q0p/Q0n as differential output signal Zp/Zn. If B1p/B1n is logically high ("1"), multiplexor 606 outputs Q1p,Q1n as differential output signal Zp/Zn. The operation of the 4-input multiplexor is illustrated by the truth table in TABLE C.

TABLE C

| B0 | B1 | Q0 | Q1 | Z |
|---|---|---|---|---|
| 0 | 0 | A0 | A2 | A0 |
| 0 | 1 | A0 | A2 | A2 |
| 1 | 0 | A1 | A3 | A1 |
| 1 | 1 | A1 | A3 | A3 |

It will be appreciated by one skilled in the art that the principles used in building 2-input and 4-input multiplexors may be extended to build n-input multiplexors, where n is any whole number greater than 2.

FIG. 7 illustrates a logical AND gate 700 embodying principles of the present invention. The AND gate 700 is implemented using the differential CMOS cell 400 of FIGS. 4 or 5. As shown in FIG. 7, the A0p input of the FIG. 4 multiplexor is tied to a low voltage (logic "0"), and the A0n input is tied to a high voltage (logic "1"). In this manner, differential output Z will only be asserted if both the A1 and B inputs of the differential CMOS logic cell 702 are asserted. Table D summarizes the operation of AND gate 700.

TABLE D

| A1 | B | Z |
|----|---|---|
| 0  | 0 | 0 |
| 0  | 1 | 0 |
| 1  | 0 | 0 |
| 1  | 1 | 1 |

FIG. 8 illustrates a logical OR gate 800 constructed similarly to the above described logical AND gate 700. The OR gate 800 is again implemented using the differential CMOS cell 400 of FIGS. 4 or 5. As shown in FIG. 8, the A1p input of the FIG. 4 multiplexor is tied to a high voltage (logic "1"), and the A1n input is tied to a low voltage (logic "0"). In this manner, differential output Z will be asserted if either or both of the A1 and/or B inputs to the differential CMOS logic cell 802 is asserted. Table E summarizes the operation of OR gate 800.

TABLE E

| A0 | B | Z |
|----|---|---|
| 0  | 0 | 0 |
| 0  | 1 | 1 |
| 1  | 0 | 1 |
| 1  | 1 | 1 |

Figure 9:
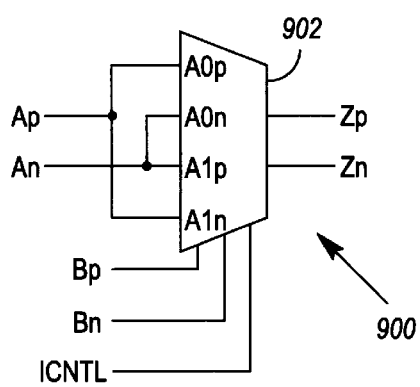
FIG. 9 is a schematic of a logical exclusive-OR gate (i.e., XOR gate) implemented using the differential CMOS cell of the present invention.

FIG. 9 illustrates an exclusive-OR or "XOR" gate 900 which is implemented using the differential CMOS cell 400 of FIGS. 4 or 5. As shown in FIG. 9, an input signal A, comprising differential components Ap/An is cross-coupled to differential inputs A0p/A0n and A1p/A1n. Accordingly, signal Ap is tied to both the A0p and A1n inputs. Likewise, signal An is tied to the A0n and A1p inputs. According to the cross-coupled connections of the differential input signal Ap/An with the differential inputs A0p/A0n and A1p/A1n, the differential inputs A0p/A0n and A1p/A1n are guaranteed to be inverse polarities of each other. The differential input signal Ap/An therefore acts as one input to an XOR cell 902, and the differential select input signal Bp/Bn acts as the other input to the XOR cell 902. Thus, if the select input signal B is logically low ("0"), A0 will be output as Z, which will only be logically high if A0 is logically high ("1"). Likewise, if select input signal B is logically high ("1"), A1 will be output as Z. Since A1 is inversely coupled to A, A1 reflects the complement of A. Thus if A1 is high ("1"), A is low ("0"). Since when B is high, Z will only be logically high ("1") if A1 is logically high, this means that Z will only be high when A is low. Accordingly, the output of the differential CMOS logic cell 802 will only be logically high ("1") if either but not both of the input signal A, and the select input signal B, are logically high ("1"). Table F illustrates the functionality of the logical XOR gate of FIG. 9.

TABLE F

| A | B | Z |
|---|---|---|
| 0 | 0 | 0 |

TABLE F-continued

| A | B | Z |
|---|---|---|
| 0 | 1 | 1 |
| 1 | 0 | 1 |
| 1 | 1 | 0 |

Figure 10:
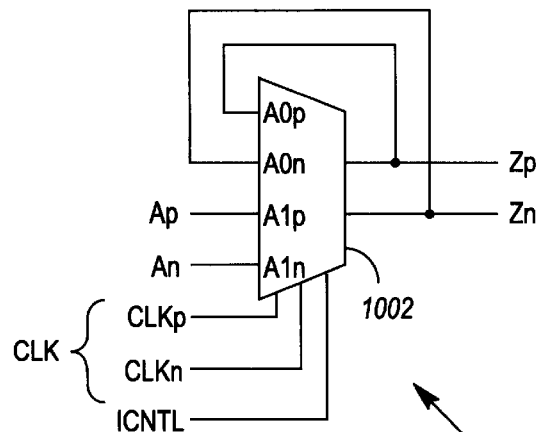
FIG. 10 is a schematic of a latch implemented using the differential CMOS cell of the present invention.

FIG. 10 illustrates a latch 1000 embodying principles of the present invention. The latch 1000 is implemented using the differential CMOS cell 400 of FIGS. 4 or 5. As shown in FIG. 10, the A0p input of the FIG. 10 multiplexor is tied to the Zp output. Likewise, the A0n input is tied to the Zn output. A differential logic signal A is provided to the A1p,A1n inputs, and a differential clock signal, CLK, comprising components CLKp and CLKn is provided to the mutliplexor's select input. In this manner, the differential CMOS cell 1002 serves to latch signal A.

Figure 11:
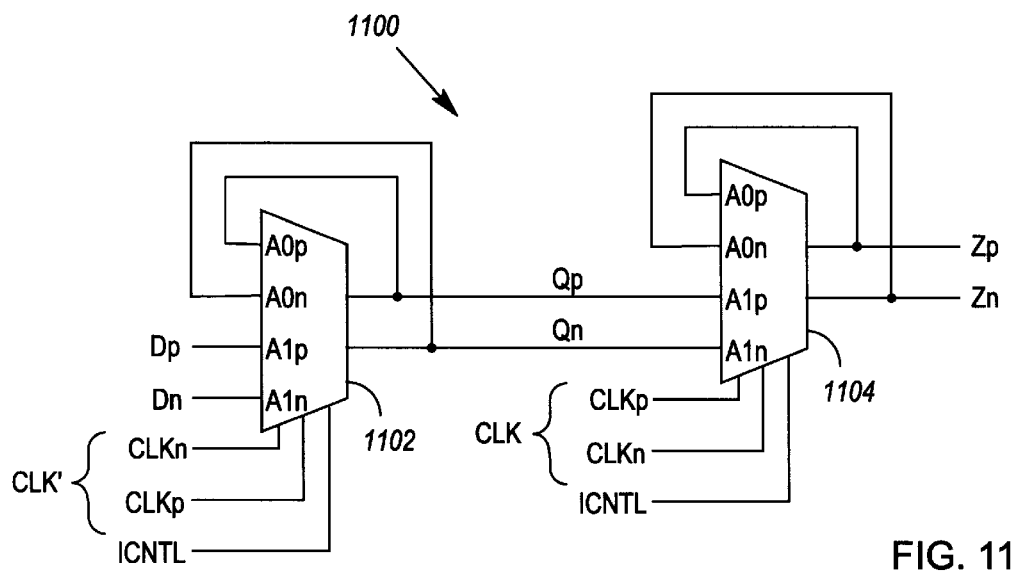
FIG. 11 is a schematic of a D-type flip-flop implemented using the differential CMOS cell of the present invention.

FIG. 11 is a schematic block diagram of a D-type flip-flop 1100 which is implemented using two differential CMOS cells 1102 and 1104. As shown in FIG. 11, the D-type flip-flop 1100 comprises a first-stage differential CMOS cell 1102. The inverse of a differential clock signal, CLK' (comprising components CLKn and CLKP), is input to differential CMOS cell 1102 as a select signal. An input signal D, comprising a differential input signal pair Dp,Dn, is input to the D-type flip-flop 1100 as the differential input signal A1p/A1n of first-stage CMOS cell 1102. An intermediate output signal Q, comprising a differential output signal Qp/Qn, is output on the Z outputs Zp,Zn of the CMOS cell 1102. The D-type flip-flop of FIG. 11 also includes a second-stage differential CMOS cell 1104. A differential clock signal, CLK (comprising components CLKp and CLKn), is input to differential CMOS cell 1104 as its select signal. Intermediate output signal Q, comprising the intermediate differential output signal pair Qn,Qp, is input to the CMOS cell 1104 as the differential input signal A1p,A1n. An output signal Z, comprising a differential output signal Zp/Zn, is output on the Z outputs Zp/Zn of the CMOS cell 1104.

In operation, when clock signal CLK is low, the first stage differential CMOS cell 1102 selects the input signal D receive as input A1 to be output as Q. Concurrently, the second stage differential CMOS cell 1104 selects the output signal Z, which is received as input A0, to be output as Z. In other words, second stage CMOS cell 904 holds the current output as long as CLK is low. When the clock signal CLK goes high, the first stage differential CMOS cell 1102 selects the intermediate output signal Q, which is received as input A0, to be output as Q (i.e., CMOS cell 1102 holds the current value of Q as its output). Since the value of Q at the moment the clock signal CLK goes high is the value of input D at this moment, the differential CMOS cell 1102 essentially latches the value of D and holds it as the intermediate output signal Q as long as CLK remains high. Concurrently, with clock signal CLK high, the second stage differential CMOS cell 1104 selects the intermediate output signal Q, which is received as input A1, to be output as the output signal Z. In summary, while clock signal CLK is low, the data D is read into the first stage cell 1102, while the second stage CMOS cell 1104 is holding the previous latched value of D as output Z. On the rising edge of the clock signal CLK, data D is latched and held as Q. On the next falling edge of the clock signal CLK, Q is latched by second stage CMOS cell 1104 and held as output signal Z. Accordingly, the output Z of the D-type flip-flop always holds the D-input of the previous clock phase.

Figure 12:
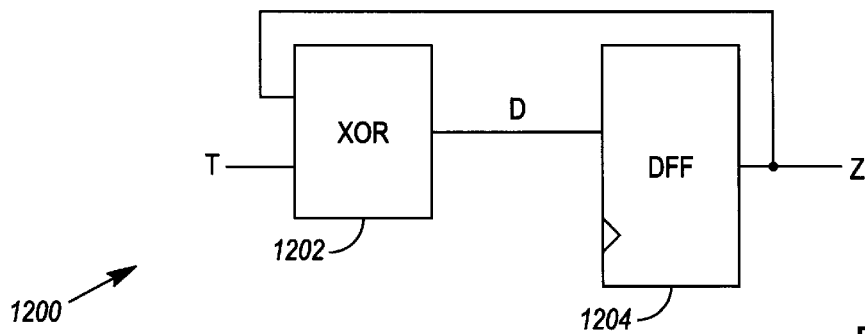
FIG. 12 is a schematic of a toggle flip-flop implemented using the differential CMOS cell of the present invention.

FIG. 12 is a schematic block diagram of a "toggle" or "T" flip-flop. The logic function of a T flip-flop is given in TABLE G (where ~Q is the inverse of Q).

TABLE G

| T | Q+ |
|---|---|
| 0 | Q |
| 1 | ~Q |

As illustrated in Table G, the output of a T flip-flop changes state when toggled by a pulse. As shown in FIG. 12, the T flip-flop 1200 is implemented with an XOR gate 1202 implemented as shown in FIG. 9, which feeds into a D-type flip-flop 1204 which is implemented as shown in FIG. 11.

The various types of logic gates and logic functions implemented in FIGS. 2–12 are presented to illustrate the wide variety of different logic functions that can be implemented using the differential CMOS cell of the present invention. It will be appreciated by one skilled in the art that many other logic functions can be implemented by utilizing the differential CMOS cell of the present invention in various other configurations. Furthermore, the polarity of the connections of one or more of the various input and output signals of the basic differential CMOS cell of the present invention may be reversed in order to implement a wide variety of other logic functions. Finally, the implementations of each of the logic gates of FIGS. 2–12 may be alternatively implemented, using complementary logic (i.e., PFETs substituted for NFETs and vice versa), or any other known or hereinafter known equivalent implementations for any of the circuit components. Accordingly, the logic gates and functions presented herein are meant by way of example and not limitation.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A CMOS circuit comprising:
at least three differential CMOS cells, each differential CMOS cell comprising:
first and second arm circuits connected in parallel between a current source and a voltage source;
wherein the first arm circuit comprises a first primary input switch, a first output node, a first resistive load, and first and second secondary input switches, the first primary input switch being coupled to the current source, the first resistive load being coupled between the first output node and the voltage source, the first secondary input switch being coupled between the first primary input switch and the first output node, and the second secondary input switch being coupled between the first primary input switch and a second output node; and
wherein the second arm circuit comprises a second primary input switch, the second output node, a second resistive load, and third and fourth secondary input switches, the second primary input switch being coupled to the current source, the second resistive load being coupled between the second output node and the voltage source, the third secondary input switch being coupled between the second primary input switch and the first output node, and the fourth secondary input switch being coupled between the second primary input switch and the second output node;
wherein the first and second output nodes of first and second differential CMOS cells are respectively connected to control inputs of the first, second, third, and fourth secondary input switches of a third differential CMOS cell;
whereby when a first differential select signal is received at control inputs of the primary input switches of the first and second differential CMOS cells, and a second differential select signal is received at control inputs of the primary input switches of the third differential CMOS cell, one of four differential signals received by the secondary input switches of the first and second differential CMOS cells is output at the first and second output nodes of the third differential CMOS cell.

2. A differential CMOS cell, comprising:
first and second arm circuits connected in parallel between a current source and a voltage source;
wherein the first arm circuit comprises a first primary input switch, a first output node, a first resistive load, and first and second secondary input switches, the first primary input switch being coupled to the current source, the first resistive load being coupled between the first output node and the voltage source, the first secondary input switch being coupled between the first primary input switch and the first output node and having a control input tied to a logic low, and the second secondary input switch being coupled between the first primary input switch and a second output node and having a control input tied to a logic high; and
wherein the second arm circuit comprises a second primary input switch, the second output node, a second resistive load, and third and fourth secondary input switches, the second primary input switch being coupled to the current source, the second resistive load being coupled between the second output node and the voltage source, the third secondary input switch being coupled between the second primary input switch and the first output node, and the fourth secondary input switch being coupled between the second primary input switch and the second output node;
whereby when complementary components of a first differential logic signal are respectively received at control inputs of the third and fourth secondary input switches, and complementary components of a second differential logic signal are respectively received at control inputs of the first and second primary input switches, the differential output signal produced by the first differential CMOS cell represents a logical AND of the first and second differential logic signals.

3. A differential CMOS cell, comprising:
first and second arm circuits connected in parallel between a current source and a voltage source;
wherein the first arm circuit comprises a first primary input switch, a first output node, a first resistive load, and first and second secondary input switches, the first primary input switch being coupled to the current source, the first resistive load being coupled between the first output node and the voltage source, the first secondary input switch being coupled between the first primary input switch and the first output node, and the second secondary input switch being coupled between the first primary input switch and a second output node; and
wherein the second arm circuit comprises a second primary input switch, the second output node, a second resistive load. and third and fourth secondary input switches, the second primary input switch being coupled to the current source, the second resistive load being coupled between the second output node and the voltage source, the third secondary input switch being coupled between the second primary input switch and the first output node and having a control input tied to a logic high, and the fourth secondary input switch being coupled between the second primary input switch and the second output node and having a control input tied to a logic low;

whereby when complementary components of a first differential logic signal are respectively received at control inputs of the first and second secondary input switches, and complementary components of a second differential logic signal are respectively received at control inputs of the first and second primary input switches, the differential output signal produced by the first differential CMOS cell represents a logical OR of the first and second differential logic signals.

4. A CMOS circuit, comprising:

at least two differential CMOS cells, each differential CMOS cell comprising:

first and second arm circuits connected in parallel between a current source and a voltage source;

wherein the first arm circuit comprises a first primary input switch, a first output node, a first resistive load, and first and second secondary input switches, the first primary input switch being coupled to the current source, the first resistive load being coupled between the first output node and the voltage source, the first secondary input switch being coupled between the first primary input switch and the first output node, and the second secondary input switch being coupled between the first primary input switch and a second output node;

wherein the second arm circuit comprises a second primary input switch, the second output node, a second resistive load, and third and fourth secondary input switches, the second primary input switch being coupled to the current source, the second resistive load being coupled between the second output node and the voltage source, the third secondary input switch being coupled between the second primary input switch and the first output node, and the fourth secondary input switch being coupled between the second primary input switch and the second output node;

wherein a control input of the first secondary input switch of a first differential CMOS cells is connected to the first output node of the first differential CMOS cell;

wherein a control input of the second secondary input switch of the first differential CMOS cell is connected to the second output node of the first differential CMOS cell;

wherein a control input of the first secondary input switch of a second differential CMOS cell is connected to the first output node of the second differential CMOS cell;

wherein a control input of the second secondary input switch of the second differential CMOS cell is connected to the second output node of the second differential CMOS cell; and wherein the first and second output nodes of the first differential CMOS cell are respectively connected to the third and fourth secondary input switches of the second differential CMOS cell;

whereby when a differential clock signal is received at control inputs of the primary input switches of the first differential CMOS cell, an inversion of the differential clock signal is received at control inputs of the primary input switches of the second differential CMOS cell, and complementary components of a first differential logic signal are respectively received at control inputs of the third and fourth secondary switches of the first differential CMOS cell, the first and second differential CMOS cells function as a D type flip-flop.

5. A CMOS circuit as in claim 4, wherein:

a third differential CMOS cell is configured such that:

control inputs of the first and fourth secondary input switches are connected to one another to form input Ap; and control inputs of the second and third secondary input switches are connected to one another to form input An;

the first and second output nodes of the third differential CMOS cell are respectively connected to the control inputs of the third and fourth secondary input switches of the first differential CMOS cell;

the first secondary input switch of the third differential CMOS cell is connected to the first output node of the second differential CMOS cell; and the second secondary input switch of the third differential CMOS cell is connected to the second output node of the second differential CMOS cell;

whereby when the differential clock signal is received at control inputs of the primary input switches of the first differential CMOS cell, the inversion of the differential clock signal is received at control inputs of the primary input switches of the second differential CMOS cell, and a second differential logic signal is received at the primary inputs of the third differential CMOS cell, the first, second, and third differential CMOS cells function as a T type flip-flop.

* * * * *